United States Patent [19]

Takahashi et al.

[11] Patent Number: 4,865,418
[45] Date of Patent: Sep. 12, 1989

[54] CRYSTALLINE OPTICAL FIBER AND ITS METHOD OF MANUFACTURE

[76] Inventors: Kenichi Takahashi; Noriyuki Yoshida, both c/o Osaka Works of Sumitomo Electric Industries, Ltd., No. 1-3, Shimaya 1-chome, Konohana-ku, Osaka-shi, Osaka, Japan

[21] Appl. No.: 26,323

[22] Filed: Mar. 16, 1987

[30] Foreign Application Priority Data

Mar. 15, 1986 [JP] Japan ................................. 61-57477
Mar. 18, 1986 [JP] Japan ................................. 61-61545

[51] Int. Cl.⁴ ............................................. G02B 6/02
[52] U.S. Cl. .............................. 350/96.30; 350/96.29; 350/96.34; 264/1.5
[58] Field of Search ............... 350/96.29, 96.30, 96.33, 350/96.34; 264/1.5

[56] References Cited

U.S. PATENT DOCUMENTS 4,253,731 3/1981 Anderson et al. ........... 350/96.30 X
4,428,646 1/1984 Lighty .............................. 350/96.31
4,490,008 12/1984 Murakami et al. ................ 350/96.34
4,521,073 6/1985 Murakami et al. .......... 350/96.30 X
4,678,274 7/1987 Fuller ................................ 350/96.34

FOREIGN PATENT DOCUMENTS 0172988 10/1985 European Pat. Off. .
0208507 12/1982 Japan .
0208508 12/1982 Japan .

OTHER PUBLICATIONS

Patent Abstracts of Japan, vol. 7, No. 64, 03/17/83, European Patent Search.

Primary Examiner—William L. Sikes
Assistant Examiner—Akm E. Ullah

[57] ABSTRACT

A crystalline metal halide optical fiber having a two or a three layer structure. The core consists of relatively small crystals. An inner crust surrounds the core and has the same composition but consists of relatively large crystals. An optical outer crust surrounds the inner crust and has a different composition from the inner crust but has generally the same sized crystals. The differing crystal sizes can be produced from a preform by extruding a crystal at a low uniform temperature at a relatively high speed.

11 Claims, 2 Drawing Sheets

CRYSTALLINE OPTICAL FIBER AND ITS METHOD OF MANUFACTURE

BACKGROUND OF THE INVENTION

1. Field of the Invention

The present invention relates to a crystalline optical fiber for infrared rays which has a core-crust structure and to a method of manufacturing the crystalline optical fiber.

2. Background of the Invention

A quartz glass fiber has been widely used for optical communication and has produced good results. There are two types of quartz glass fibers. One of them is the step index type. The other is the graded index type. The quartz glass fiber of the step index type has a double structure consisting of a core and a crust. This crust in a quartz fiber is usually called a cladding.

Although such quartz glass fibers have good properties, they can only be used for visible light or near infrared rays.

The light of a $CO_2$ (carbon dioxide) laser has a wide range of use for industry and medical treatment. However, since the wave-length of the light is as long as 10.6 $\mu$m, it cannot be transmitted with a low loss through any glass fiber developed so far.

Although some fibers have been developed for a $CO_2$ laser, a relatively large loss is caused at the time of the transmission of the light of the laser. Therefore, the fibers are only used for communication at a short distance of several meters or less. However, the light of the $CO_2$ laser is often used as power for material processing. Therefore, the fibers are useful enough for the light as power for such purposes.

A glass fiber and a crystalline fiber have been developed as optical fibers through which the light of a $CO_2$ laser can be transmitted. The glass fiber is made of a chalcogenide glass, a fluoride glass or the like. The crystalline fiber is made of a metal halide crystal which can be of three broadly classified kinds as follows:

(1) Silver halide crystal
   AgBr, AgCl, AgI or a mixture thereof
(2) Thallium halide crystal
   TlBr, TlCl, TlI or a mixture thereof
(3) Alkali halide crystal
   CsI, CsBr or a mixture thereof Other crystalline optical fibers of ZnSe, ZnS and so forth have also been develped.

One of methods of manufacturing a crystalline optical fiber is an extrusion method in which the manufacturing is started with a preform. Other methods include a pull-up method and a pull-down method in which the manufacturing is started with a molten material.

In the extrusion method, the preform of a single crystal is put in a container, softened by heat and extruded through a die to manufacture a thin fiber.

In the pull-up and the pull-down methods, the material is put in a crucible and is melted. In the pullup method, a seed crystal is immersed in the molten material and gradually pulled up in the same manner as an ordinary growth of a crystal. In the pull-down method, a hole is previously provided in the bottom of the crucible so that a crystal is gradually pulled down through the hole.

Since the speed of the extrusion is high, the productivity of the extrusion method is higher than those of the pull-up and the pull-down methods.

The present invention relates particularly to an improvement in manufacturing a crytalline optical fiber in the extrusion method.

Each of the above-mentioned metal halide crystalline optical fibers is normally made of only a core with no crust. The core is inserted into a polymer tube when the core is used as the optical fiber. In that case, the air between the core and the tube acts as a crust. Since the core and the air differ from each other in refractive index, infrared rays are transmitted through the core while being totally reflected by the boundary between the core and the air. However, the air only acts as a very unstable crust.

The surface of the core, which plays an extremely important role in the transmission of light, is likely to be contaminated or damaged depending on the environment around the optical fiber. When the surface of the core is contaminated or a water drop clings to the surface, an intense energy absorption takes place because the contaminations and water have large absorption coefficient in the infrared region. Since the light of a $CO_2$ laser is intense, heating results from the absorption to destroy the optical fiber However, such a problem can be solved by providing the optical fiber with a crust which prevents the absorption.

In Japanese Patent Application (OPI) No. 132301/81 (the term "OPI" as used herein means an "unexamined published application") published on Oct. 26, 1981, it was proposed that the peripheral surface of the core of an optical fiber for infrared rays be coated with a metal film through evaporation in a vacuum so as to protect the core and to prevent the infrared rays from leaking out of the surface of the core. The film is made of gold with a thickness of 1 $\mu$m. Although gold reflects infrared rays well enough to effectively confine them in the core, the optical fiber coated with the gold ha disadvantages as described next. It is difficult to uniformly coat the peripheral surface of the core of circular cross section with the gold by evaporation. The gold prepared as the material for the coating film is significantly wasted. The thickness of the coating metal film cannot be made larger than about 1 $\mu$m. For that reason, the film cannot physically protect the core or sufficiently confine the infrared rays in the core. Since gold is not transparent to infrared rays, the gold intensely absorbs them so that the gold is heated. Also for the same reason, the thickness of the film cannot be made large. Therefore, the crust on the core should be made of a material through which the infrared rays are well transmitted similarly to a quartz glass fiber Although a method of manufacturing a crystalline optical fiber comprising a core of a crystal for infrared rays and a crust has been proposed, the number of the manufacturing steps of the method is large and the method is complicated.

A method of manufacturing a core and a crust at a single time unlike the above-mentioned prior art was proposed in the Japanese Patent Application (OPI) No. 208506/82 published on Dec. 21, 1982. In this method, a solid solution crystal of TlBr and TlI is used. The preformed crystal is put in a die, heated and extruded through a thin nozzle to manufacture a thin fiber. The temperature of the crystal seems to play an important role in the method. The temperatures of the die and the nozzle and the speed of the extrusion are set at 300° C., 220° C. and 10 mm/min., respectively. As a result, the crystal grains of the peripheral portion of the fiber are made small and those of its central portion are made large. Since the central and the peripheral portions differ from each other in crystal grain diameter, the fiber has a double structure consisting of a core and a crust. The optical fiber having the core-crust structure is thus manufactured in the simple extrusion method. The lower the temperatures are, the smaller the diameter of each crystal grain is. The grain diameter is 20 μm, 100 μm, and 200 μm, respectively when the temperature of the nozzle is 300° C., 350° C., and 400° C. Since the temperature of the nozzle is lower than that of the die, the peripheral portion of the material being extruded through the nozzle is cooled more than the central portion thereof so that the crystal grains of the peripheral portion become small and those of the central portion become large. The phenomenon that the double structure of the optical fiber confines light therein is explained by the facts that the angle of divergence of the light is small and the transmission factor of the fiber is high. The transmission factor of an optical fiber made of the same material but having no core-crust structure is 90%, while that of the optical fiber having the core-crust structure is 92%. In the method, heaters are non-uniformly distributed in order to make the temperature of the nozzle lower than that of the die.

SUMMARY OF THE INVENTION

It is an object of the present invention to provide an extrusion method in which a core is not previously manufactured and then coated with a cladding, but the core and crust of a crystalline optical fiber having a core-crust structure are manufactured simultaneously and integrally.

It is another object of the present invention to provide an optical fiber which is an improvement of an optical fiber made of a mixed crystal of AgBr and AgCl and has a boundary between a core and an inner crust and another boundary between the inner crust and an outer crust so that the light of a $CO_2$ laser can be much better confined in the core.

DETAILED DESCRIPTION OF THE PREFERRED EMBODIMENTS

A first method of manufacturing a crystalline optical fiber according to the present invention is hereafter described with reference to the drawings.

Figure 1A:
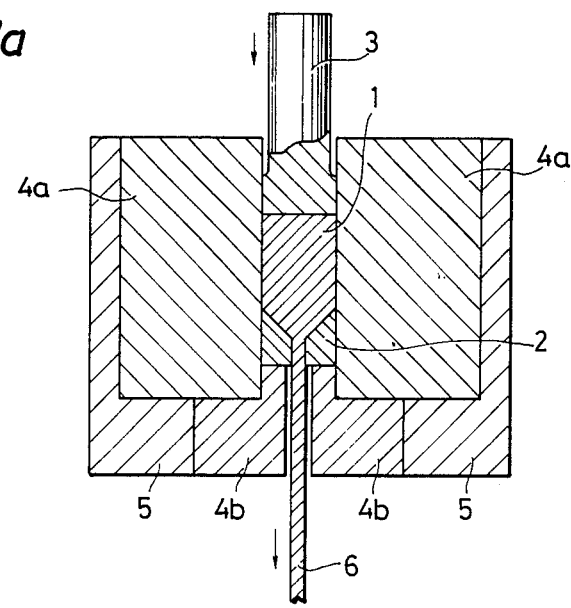
FIG. 1 shows a longitudinal sectional view of a device for manufacturing a crystalline optical fiber according to the present invention.

FIG. 1a shows a sectional view of a crystalline optical fiber extrusion device for performing the method. A preform 1 is a good single crystal of a metal halide. Dies 4a and 4b define a cylindrical space, in which the preform 1 is put. An extrusion die 2 is provided at the downstream end of the space. A heater 5 for heating the dies 4a and 4b is provided around them. Thermocouples (not shown the drawing) are provided in the dies 4a and 4b to monitor the temperatures thereof. The heating power of the heater 5 is controlled depending on the monitored temperatures to keep them at prescribed levels.

A ram 3 for extruding the preform 1 through the extrusion die 2 is provided so that the ram 3 can be moved back and forth in the cylindrical space.

The constitution of the extrusion device show in FIG. 1a is well known. The method is characterized by the temperature and extrusion speed of the preform 1.

In many conventional methods of extruding a crystalline optical fiber, the temperatures of the dies are 250° C. or more. In most of the methods, the temperatures are 300° C. or more. In the methods, the speed of the extrusion is 10 mm/min. or less. In most of the methods, the speed is 5 mm/min. or less.

In the method according to the present invention, the temperature of the dies 4a and 4b is 80° to 200° C., and the speed of the extrusion is 5 to 30 mm/min. Therefore, in the method the temperature is lower and the speed is higher than in the conventional methods; particularly when the invention is used at extrusion speeds greater than 10 mm/min.

The metal halide crystal used as the preform 1 is as follows:
(1) Silver halide crystal
   AgCr, AgBr, or a mixture thereof
(2) Thallium halide crystal
   TlCl, TlBr, KRS-5 or a mixture thereof
   (KRS-5 is a well known mixture of TlBr and TlI)
(3) Alkali halide crystal
   CsBr CsI, or a mixture thereof A very small quantity of other elements, which do not degrade the optical properties of the metal halide crystal, may be added thereto for the purpose of improving the mechanical properties of the crystal or for the like.

The metal halide crystal as the preform 1 is put in the die 4, heated at 80° to 200° C., by the heater 5 and extruded at the speed of 5 to 30 mm/min. through the extrusion die 2, so that the thin polycrystalline fiber 6 is continuously manufactured.

Figure 2A:
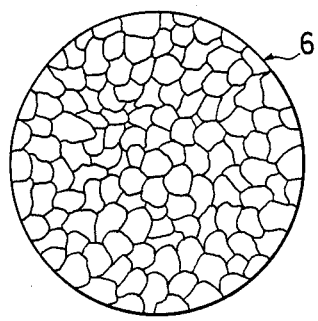
FIGS. 2a and 2c show sectional views of conventional crystalline optical fibers wherein the diameters of crystal grains thereof are nearly equal to each other throughout the cross section of the fiber.
Figure 2B:
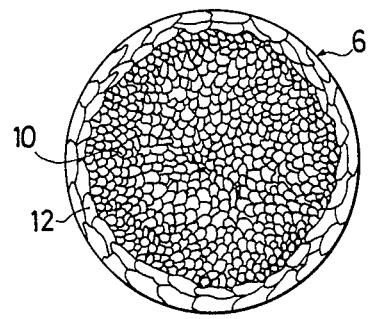
FIGS. 2b and 2d show sectional views of crystalline optical fibers manufactured according to the present invention.

FIG. 2b shows an enlarged sectional view of the polycrystalline fiber 6. The view is as seen through a microscope. It is understood from the view that a central portion 10 of the cross section of the fiber has small crystal grains and a peripheral portion 12 of the cross section thereof has large crystal grains. Since the central portion 10 having the small crystal grains is referred to as the core 10 and the peripheral portion 12 having the large crystal grains is referred to as the crust 12, the fiber can be said to have a double structure consisting of the core 10 and the crust 12.

In the method according to the present invention, the temperature at the extrusion nozzle is not made lower to set a nonuniform temperature gradient, as is done in the above-menitoned Japanese Patent Application (OPI) No. 208506/82. In the present method, the temperature of the dies 4a and 4b is uniform throughout them. The temperature is equal to that of the preform 1. If the temperature of the dies 4 is more than 200° C., the crystal grains of the central portion 10 and the peripheral portion 12 of the fiber 6 would have almost the same diameter as shown in FIG. 2a. When the temperature of the dies 4 is 200° C., a diameter difference is produced between the crystal grains of the central portion 10 and those of the peripheral portion 12. As the temperature of the dies 4 is lowered from 200° C., the number of the small crystal grains increases and that of the large crystal grains decreases, namely, the central portion 10 becomes larger. In other words, the thickness of the crust 12 becomes smaller along with the fall in the temperature and becomes larger along with the rise in the temperature. If the temperature is lower than 80° C., both the central and the peripheral portions 10 and 12 of the fiber 6 would have small crystal grains like those of the central portion 10 shown in FIG. 2b and would spread throughout the fiber 6, so that the double structure consisting of the core 10 and the crust 12 would disappear.

To be brief, the core-crust structure 10 would disappear above the temperature of 200° C., and the crust 12 would disappear below the temperature of 80° C. For that reason, the double structure would disappear under such temperature conditions.

The ratio of the average diameter $D_1$ of each crystal grain of the crust 12 of the fiber 6 to that $d_2$ of each crystal grain of the core 10 is 5 or more. The difference between the core 10 and the crust 12 is the difference between the sizes of their crystal grains. The ratio needs to be 5 or more in order to make the difference significant.

The thickness of the crust 12 needs to be considerably large in order to protect the core 12 and effectively confine light therein. For that purpose, the thickness of the crust 12 needs to be 5% or more of the diameter of the core 10.

In the prior art disclosed in the above-mentioned Japanese Patent Application (OPI) No. 208506/82, a thallium halide crystal fiber having a core-crust structure is manufactured by extrusion. However, the crystal grains of the core of the fiber are large and those of the crust thereof are small, in contrast with the optical fiber manufactured in the method according to the present invention. In that prior art, the temperature of the nozzle is made lower to set a temperature gradient on the cross section of the fiber to make the crystal grains of the crust small. Therefore, the prior art is greatly different from the method of the invention.

As described above, in the method according to the present invention, the temperature of the extruded crystal material and the speed of the extrusion are prescribed at 80° to 200° C., and 5 to 30 mm/min., respectively. These conditions cause the extrusion of the crystalline optical fiber 6 comprising the core 10 of small crystal grains and the crust 12 of large crystal grains.

Figure 1B:
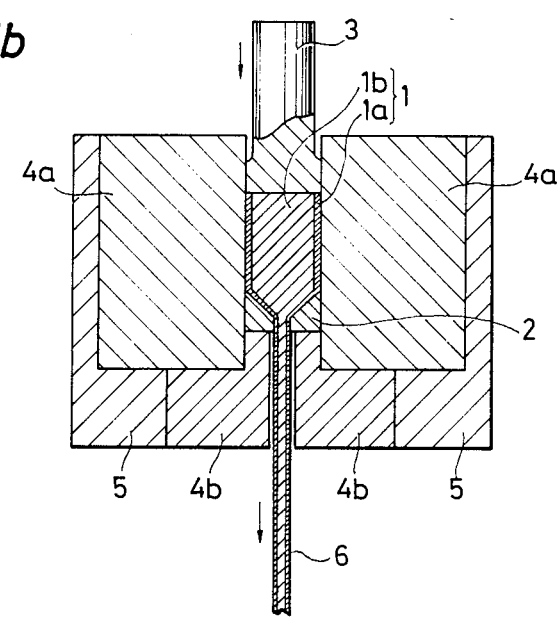

A second method of manufacturing a crystalline optical fiber according to the present invention is hereafter described. FIG. 1b shows a sectional view of a crystalline optical fiber extrusion device for performing the method. A preform 1 is a good crystal comprising a core 1b and a crust 1a. Both the core 1a and the crust 1b is made of a mixture of AgBr and AgCl. Since the composition ratios of the core and the crust are not equal to each other, they come to have different structures when the preform 1 is extruded.

The core 1a is a mixed crystal whose main constituent is AgBr and contains 0.1 to 10% by weight of AgCl, the quantity of which is referred to as x % by weight hereinafter.

The crust 1b is a crystal made of only AgCl or is a mixed crystal whose main constituent is AgCl and which contains 0.1 to 10% by weight of AgBr, the quantity of which is referred to as y % by weight hereinafter.

Amount of AgCl added to the main constituent of AgBr in the core 1a is larger than the amount of AgBr added to the main constituent of AgCl in the crust 1b, namely, a relationship $y < x$ is set.

The composition ratios of the core and the crust are simply expressed in two cases as follows:
 (1) Core AgBr : AgCl=100: x
 Crust AgCl : AgBr=100: y
 $0.1 \leq x$; $y \leq 10$; $y > x$
 (2) Core AgBr : AgCl=100: x
 Crust AgCl : AgBr=100 : 0
 $0.1 \leq x \leq 10$ Alternatively, the following case is also avilable in the present invention:

The core 1a is a mixed crystal whose main constituent is AgCl and contains 0.1 to 10% by weight of AgBr, the quantity of which is referred to as x % by weight hereinafter.

The crust 1b is a crystal made of only AgCl, or is a mixed crystal whose main constituent is AgCl and which contains 0.1 to 10% by weight of AgBr, the quantity of which is referred to as y % by weight hereinafer. Amount of AgBr added to the main constituent of AgCl in the core is larger than the amount of AgBr added to the main constituent of AgCl in the crust, namely, a relationship $y \leq x$ is set.

The composition ratios of the core and the crust are simply expressed in two cases as follows:
 (1) Core AgCl : AgBr=100: x
 Crust AgCl : AgBr=100: y
 $0.1 \leq x$; $y \leq 10$; $y < x$
 (2) Core AgCl : AgBr=100: x
 Crust AgCl : AgBr=100 : 0
 $0.1 \leq x \leq 10$ When the preform 1 is extruded in the method, the core 1a of the preform 1 becomes, as shown in FIG. 2d, the core 10 and an inner crust 12a which are hereinafter sometimes referred to as a core-inner-crust portion, and the crust 1b of the preform 1 become an outer crust 12b.

It is necessary to prepare the preform 1 to perform the method. The core 1a of the preform 1 is first grown as a single crystal in a pull-up method or a boat method. The core 1a is then cylindrically ground. After that, the crust 1b of the preform 1 is grown on the cylindrical core. The preform 1 is thus manufactured as a mixed crystal of AgBr and AgCl. A very small quantity of other elements, which do not degrade the optical properties of the fiber, may be added to the preform 1 for the purpose of improving the mechanical properties of the fiber or for the like.

As dies shown in FIG. 1b, dies 4a and 4b define a cylindrical space, in which the preform 1 is put as a starting material. An extrusion die 2 having a small hole is provided at the downstream end of the cylindrical space to extrude the softened preform 1 through the extrusion die.

A heater 5 for uniformly heating the dies 4a and 4b and the preform 1 is provided around the dies 4a and 4b. Thermocouples (not shown in the drawing) are provided in the dies 4 to monitor their temperatures. The heating power of the heater 5 is controlled depending on the monitored temperatures to keep them at prescribed levels.

A ram 3 extrudes the preform 1 through the extrusion die 2 and is provided so that the ram 3 can be moved back and forth in the cylindrical space. The constitution of the extrusion device shown in FIG. 1b is well known.

The method according to the present invention is characterized by the composition of the preform 1 and the temperature and speed of the extrusion.

In many conventional methods of extruding a crystalline optical fiber, the temperature of the dies is 250° C. or more. In most of the methods, the temperature is 300° C. or more. In the methods, the speed of the extrusion is 10 mm/min. or less. In most of the methods, the speed is 5 mm/min. or less.

In the method according to the present invention, the temperature of the dies 4 is 80° to 200° C. and the speed of the extrusion is 5 to 30 mm/min. The temperature and the speed in the methods are lower and higher than those in the conventional methods, respectively.

The double structured preform 1, which is the mixed crystal of silver halides, is put in the cylindrical space inside the dies 4, covered with the ram 3 and heated at the temperature of 80° to 200° C. by the heater 5 so that the preform is not melted but is softened.

An appropriate mechanical force is applied to the ram 3 to extrude the polycrystalline optical fiber 6 at the speed of 5 to 30 mm/min. from the extrusion die 2. The thin fiber 6 is thus continuously manufactured.

FIG. 2d shows an enlarged sectional view of the polycrystalline optical fiber 6. A thick line in the drawing represents a boundary Y between the core 1a and crust 1b of the fiber. The boundary is previously present in the preform 1. Thin lines in the drawing represent the boundaries between the crystal grains of the fiber. The crystal grains of the central portion 10 of the fiber are very small, while those of the peripheral portions 12a and 12b are very large.

The ratio of the diameter $D_2$ of each crystal grain of the central portion of the fiber to that $D_1$ of each crystal grain of the peripheral portion thereof is 5 or more. Although the forms and dimensions of the crystal grains are not uniform, there is a clear difference between the sizes of the crystal grains of the central and the peripheral portions. The difference neither gradually nor randomly takes place but does take place nearly across a single circle. This is an important fact.

Because of the difference between the sizes of the crystal grains, another boundary X is produced. The boundary X is concentric to the peripheral surface of the fiber. Therefore, the fiber has two boundaries X and Y. The boundary X results from the difference between the sizes of the crystal grains. The other boundary Y results from the difference between the compositions of the core 1a and crust 1b of the preform 1. Inside and outside the boundary Y within the inner and outer crusts 12a and 12b, the crystal grains are large on the whole and do not differ from each other in diameter. However, since the compositions inside and outside the boundary Y are made different from each other in the manufacturing of the preform 1, the different compositions remain inside and outside the boundary Y.

If the temperature was higher than 200° C., the crystal grains of the central and peripheral portions 10, 12a and 12b of the fiber would have almost the same diameter throughout the cross section of the fiber. In that case, the crystal grains would uniformly have a large diameter as shown in FIG. 2c.

Figure 2C:
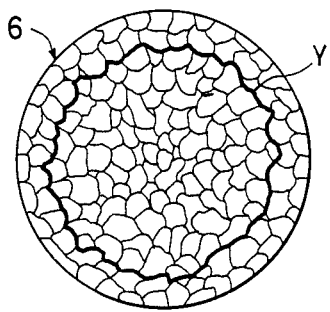
Figure 2D:
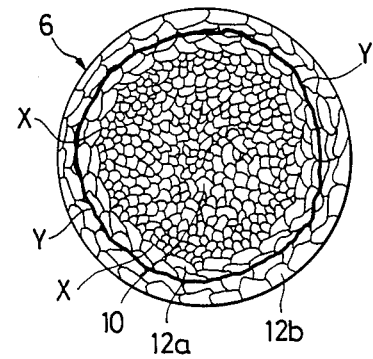

A fiber whose structure is shown in FIG. 2c is hereinafter used as a comparison example manufactured in a conventional method. The structure has only a core-crust boundary Y (shown by a thick line in the drawing) which results from the difference in composition.

When the temperature is 200° C., small crystal grains appear in the central portion 10 of the fiber 6. When the temperature is lower than 200° C., the crosssectional area having the small crystal grains in the central portion expands. Namely, the core of the fiber 6 becomes larger, and the crust thereof become smaller. To be brief, the thickness of the crust becomes smaller accordingly as the temperature falls. The crust extends outside the boundary X. The core extends inside the boundary X.

If the temperature was lower than 80° C., all the crystal grains of the fiber 6 would become small as though the portion 10 inside the boundary X shown in FIG. 2b was spread throughout the fiber 6, so that the core-crust structure changing across the boundary X would disappear.

In brief, the core would disappear above the temperature of 200° C. and the crust would disappear below the temperature of 80° C., so that the double structure would disappear in both these cases.

As mentioned above, the ratio of the average diameter $D_1$ of each crystal grain of the crust of the fiber 6 to that $D_2$ of each crystal grain of the core thereof is preferably 5 or more.

The thickness of the crust needs to be considerably large in order to effectively confine light in the core. The thickness needs to be 5% or more of the diameter of the core.

The diameter of each crystal grains of the central portion is several $\mu$m, while that of each crystal grain of the peripheral portion is 30 $\mu$m to several tens of $\mu$m depending on the diameter of the fiber 6. When the diameter of the fiber is 1 mm, the diameter of each crystal grain of the crust is about 50 to 100 $\mu$m. When the diameter of the fiber is 0.7 mm, the diameter of each crystal grain of the crust is about 40 to 70 $\mu$m.

In the method according to the present invention, the composition and structure of the preform are prescribed and the temperature and speed of the extrusion are prescribed at 80° to 200° C. and 5 to 30 mm/min., respectively. As a result, the crystalline optical fiber having the double structure, which consists of the core and the crust different from each other in crystal grain diameter, is characterized by the boundary X. This fiber is manufactured by the extrusion process.

When the preform 1 is extruded into the thin fiber 6 from the extrusion die 2 under high pressure, the crystal grains forming the fiber 6 are made small. After the fiber is extruded through the die 2, recrystallization occurs in which the small crystal grains are incorporated as large crystal grains. It is presumed that the speed of the recrystallization of the small crystal grains of the central portion of the fiber and that of the recrystallization of the small crystal grains of the peripheral portion thereof are made different from each other due to the nonuniformity of the stress in the fiber being extruded. This nonuniformity makes the diameter of each crystal grain of the central portion different from that of each crystal grain of the peripheral portion different and also makes the refractive index of the grains of the central portion and that of the grains of the peripheral portion different form each other due to the distribution of the stress in the fiber. The core-crust structure of the fiber functions to confine light in the core.

The optical fiber manufactured in the first method according to the present invention has the double structure as described above. When the light of a $CO_2$ laser is transmitted through such a fiber, the transmission factor is higher than that of a single-structure conventional fiber such as shown in FIG. 2a.

The crystalline optical fiber manufactured in the second method according to the present invention has the triple structure consisting of the core inside the boundary X, the inner crust between the boundaries X and Y and the outer crust outside the boundary Y. Since the fiber is manufactured from the preform having the double structure consisting of the core and the crust as described above, the fiber is provided with the triple structure.

When the light of a $CO_2$ laser is transmitted through the fiber having the triple structure, the light is efficiently confined in the core of the fiber. For that reason, the effective transmission factor of the fiber is high.

Since the crust protects the core, the transmission factor of each of the fibers manufactured in the first and the second methods is less degraded even if the surface of the fiber is scratched.

Each of the optical fibers manufactured in the first and the second methods makes it easy to obtain a light beam of smaller diameter. When the divergence of the light beam is measured by an evaluation device shown in FIG. 3, the diameter of the beam is determined in terms of the burn pattern of an acrylic resin plate. It is understood from the result of the measurement that the diameter of the light beam transmitted through each of the optical fibers is smaller than that of the light beam transmitted through the conventional fiber. In other words, the crystalline optical fibers manufactured in the first and the second methods according to the present invention confine the light of a $CO_2$ laser more effectively than the conventional fiber.

The present invention is hereafter described with detailed embodiment thereof, in which a mixed crystal of AgCl and AgBr is used. A preform is prepared which is made of the mixed crystal, whose main constituent is AgBr mixed with 0.1 to 10% by weight of AgCl or is AgCl mixed with 0.1 to 10% by weight of AgBr. If the quantity of the additive mixed in the main constituent was smaller than 0.1% by weight, crystal grains would be too large and no small crystal grains would be produced. If the quantity of the additive mixed in the main constituent was larger than 10% by weight, the crystal grains would be too small and no large crystal grains would be produced.

The preform is extruded at a temperature of 80° to 200° C., and a speed of 5 to 30 mm/min. by the extrusion device shown in FIG. 1a, so that a polycrystalline optical fiber is manufactured. The fiber has a double structure consisting of small crystal grains in the central portion of the fiber and large crystal grains in the peripheral portion thereof, as shown in FIG. 2b. The diameter of each crystal grain of the central portion is several $\mu m$, while that of each crystal grain of the peripheral portion is 30 $\mu m$ to several tens of $\mu m$. When the diameter of the fiber is 1 mm, the thickness of the peripheral portion is about 50 to 100 $\mu m$. When the diameter of the fiber is 0.7 mm, the thickness of the peripheral portion is 40 to 70 $\mu m$.

Figure 3:
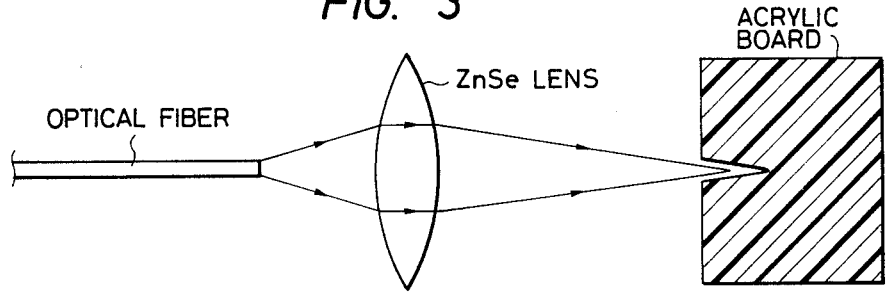
FIG. 3 shows a device for evaluating the diameter of a light beam.

The fiber is measured by the evaluation device shown in FIG. 3. The light of a $CO_2$ laser is transmitted through the fiber, condensed by a ZnSe lens and projected on an acrylic resin plate so that the surface of the plate is burnt. The burnt state of the surface is referred to as a burn pattern from which the diameter of the spot of the light beam projected on the plate is determined. The diameter of the spot of the light beam is referred to as the divergence of the beam on the acrylic resin plate. Since the light is condensed by the lens, the divergence of the light on the acrylic resin plate is nearly equal to that of the light outgoing from the end of the fiber. When the diameter of the fiber is 0.7 mm, the diameter of the spot is 0.4 mm. The same measurement is performed on the conventional crystalline fiber which has nearly crystal grains as shown in FIG, 2a and has the same composition as the fiber manufactured according to the present invention. The diameter of the spot of the light beam transmitted through the conventional fiber is 0.7 mm, which means that the light beam is distributed across the whole fiber. In contrast with that, the light beam is distributed in only the central portion (core) of the fiber manufactured according to present invention. The transmission factor of the conventional fiber is 60%, while that of the fiber manufactured according to the present invention is 68%. The transmission factor is measured again after a part of the surface of each of the fibers is scratched by sandpaper. The transmission factor of the scratched conventional fiber is 50%, while that of the scratched fiber manufactured according to the present invention is 66%. Since the surface of the core of the conventional fiber is exposed, the light beam is more likely to be scattered and absorbed due to the scratching so as to decrease the transmission factor. Since the light beam is not transmitted through the crust of the fiber manufactured according to the present invention but is transmitted through primarily through the core, the transmission factor is scarcely decreased even if the surface of the fiber is scratched.

Table 1 shows the results of the measurement of the light spot diameter and the transmission factor as to both the fibers.

TABLE 1

| | Beam spot diameter | Transmission factor |
|---|---|---|
| Crystalline optical fiber according to the present invention | 0.4 mm | 66% (*68%) |
| Conventional crystalline optical fiber | 0.7 mm | 50% (*60%) |

*value before scratching.

The present invention is hereafter described with reference to another embodiment thereof, in which a crystalline optical fiber comprising a core, an inner crust and another crust is manufactured only by extruding a preform through the use of an extrusion device. The core function to transmit the light of a $CO_2$ laser through only the central portion of the fiber. Both of the crusts coat the core to mechanically protect it and reflect the light on the boundary between the core and the inner crust. For that reason, the transmission factor of the fiber is higher than that of an optical fiber made of only a core. When the diameter of the optical fiber manufactured according to the present invention is 0.7 mm, the transmission factor of the fiber is 68%. The transmission factor of a conventional optical fiber (shown in FIG. 2c) having the same diameter and length as the fiber manufactured according to the present invention is 55%, which is 13% less than than of the present invention. Therefore, it is understood that the light of the $CO_2$ laser is very effectively transmitted through the optical fiber manufactured according to the present invention. Since the light is transmitted through only the core of the fiber, the light can be more condensed by using a ZnSe lens or the like. When the divergence of the light of the $CO_2$ laser transmitted through the fiber is measured by the evaluation device shown in FIG. 3, the light is condensed by a ZnSe lens and projected on the acrylic resin plate which is burnt by the light. The diameter of the light beam transmitted through the fiber is determined from the burn pattern of the plate. The diameter of the burn pattern made by the light beam is 0.3 mm, while that of the burn pattern made by the light beam transmitted through the conventional optical fiber is 0.6 mm. Since the conventional fiber also has a core-crust structure, the diameter of the light beam outgoing from the end of the fiber is 0.6 mm which is less than the outside diameter (0.7 mm) of the fiber. The transmission factor of the conventional fiber is also good. However, these properties of the optical fiber manufactured according to the present invention are much better than those of the conventional optical fiber.

Table 2 shows the results of measurement of the beam spot diameter and the transmission factor for both the fibers.

TABLE 2

|  | Beam spot diameter | Transmission factor |
|---|---|---|
| Crystalline optical fiber according to the present invention | 0.3 mm | 68% |
| Conventional crystalline optical fiber | 0.6 mm | 55% |

According to the present invention, a crystalline optical fiber having a double structure consisting of a core and a crust or another crystalline optical fiber having a triple structure consisting of a core, an inner crust and an outer crust can be manufactured simply by extruding preforms, through the use of an extrusion device, as described above.

Since the crystalline optical fiber having the double structure comprises the core through which the light of a $CO_2$ laser is transmitted and the crust coating the core, the transmission factor of the fiber is higher than that of an optical fiber made of only a core. Since the core is not coated with the crust in a process separate from the extrusion but both the core and the crust are simultaneously and integrally produced by the extrusion, the manufacturing of the optical fiber is very simple.

Since the crystalline optical fiber having the triple structure comprises the core through which the light of a $CO_2$ laser is transmitted and the inner and the outer crust coating the core, the light is more efficiently transmitted through the fiber than an optical fiber made of only a core or than an optical fiber made of only a crystalline core and a crust, and the light can be more condensed downstream to the outgoing end of the fiber having the triple structure, so as to project the light of heightened energy density on a workpiece or the like. For that reasons, the optical fiber having the triple structure is much more useful in industrial processing and medical treatment.

What is claimed is:

1. A crystalline optical fiber comprising a crystalline core and a crystalline crust covering said core wherein an average diameter of crystal grains of said core is smaller than an average diameter of crystal grains of said crust and wherein said core and said crust are made of the same material.

2. A crystalline optical fiber according to the claim 1, wherein a thickness of the crystalline crust is not less than 5% of the diameter of the crystalline core.

3. A crystalline optical fiber according to the claim 1, wherein an average diameter of crystal grains of the crystalline core is not more than one-fifth of an average diameter of crystal grains of the crystalline crust.

4. A crystalline optical fiber according to claim 1, wherein each of the crystalline core and the crystalline crust comprises a metal halide.

5. A crystalline optical fiber according to claim 4, wherein each of the crystalline core and the crystalline crust is mixed crystal which is made of AgBr and AgCl and whose main constituent is a first one of said AgBr and AgCl mixed with 0.1 to 10% by weight of a second one of said AgBr and AgCl.

6. A crystalline optical fiber, comprising:
an inner first portion whose main constituent is AgBr mixed with AgCl, a weight ratio of said AgCl to said AgBr being x % ($0.1 \leq x \leq 10$), said first portion comprising a crystalline core and a first crystalline crust covering said core, an average diameter of crystal grains in said core being smaller than an average diameter of crystal grains in said first crust, a first boundary being present between said core and said first crust; and
an outer second portion covering said first portion and being a second crust made either of a crystal consisting substantially of AgCl or of a mixed crystal whose main constituent is AgCl mixed with AgBr, a weight ratio of said AgBr to AgCl being y % ($0.1 \leq y \leq 10$ and $y < x$), a second boundary being present between said first crust and said second crust.

7. A crystalline optical fiber, comprising an inner first portion whose main constituent is AgCl mixed with AgBr, a weight ratio of said AgBr to said AgCl being x % ($0.1 \leq x \leq 10$), said first portion comprising a crystalline core and a first cyrstalline crust covering said core, an average diameter of crystal grains in said core being smaller than an average diameter of crystal grains in said first crust, a first boundary being present between said core and said first crust; and
an outer second portion covering said first portion and being a second crust made either of a crystal consisting substantially of AgCl or of a mixed crystal whose main constitutent is AgCl mixed with AgBr, a weight ratio of said AgBr to AgCl being y % ($0.1 \leq y \leq 10$ and $y < x$), a second boundary being present between said first crust and said second crust.

8. A crystalline optical fiber as recited in claim 6, wherein a thickness of said first crust is not less that 5% of a diameter of said core.

9. A crystalline optical fiber as recited in claim 7, wherein a thickness of said first crust is not less that 5% of a diameter of said core.

10. A crystalline optical fiber as recited in claim 6, wherein an average diameter of crystalline grains of said core is not more than 20% of an average diameter of crystalline grains of said first crust.

11. A crystalline optical fiber as recited in claim 7, wherein an average diameter of crystalline grains of said core is not more than 20% of an average diameter of crystalline grains of said first crust.

* * * * *

UNITED STATES PATENT AND TRADEMARK OFFICE
CERTIFICATE OF CORRECTION

PATENT NO. : 4,865,418

DATED : September 12, 1989

INVENTOR(S) : Kenichi TAKAHASHI and Noriyuki YOSHIDA

It is certified that error appears in the above-identified patent and that said Letters Patent is hereby corrected as shown below:

Title page, insert item [73] to read as follows:

--Sumitomo Electric Industries, Ltd.--

Signed and Sealed this

Second Day of April, 1991

Attest:

*Attesting Officer*

HARRY F. MANBECK, JR.

*Commissioner of Patents and Trademarks*